(12) United States Patent
Hsu

(10) Patent No.: US 8,491,819 B2
(45) Date of Patent: Jul. 23, 2013

(54) HIGH WORK-FUNCTION AND HIGH CONDUCTIVITY COMPOSITIONS OF ELECTRICALLY CONDUCTING POLYMERS

(75) Inventor: Che-Hsiung Hsu, Wilmington, DE (US)

(73) Assignee: E I du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 13/072,423

(22) Filed: Mar. 25, 2011

(65) Prior Publication Data

US 2011/0168952 A1 Jul. 14, 2011

Related U.S. Application Data

(62) Division of application No. 11/960,412, filed on Dec. 19, 2007, now abandoned.

(60) Provisional application No. 60/878,033, filed on Dec. 29, 2006.

(51) Int. Cl.
*H01B 1/12* (2006.01)

(52) U.S. Cl.
USPC .......................................... 252/500

(58) Field of Classification Search
USPC .......................................... 252/500
See application file for complete search history.

(56) References Cited

U.S. PATENT DOCUMENTS

| | | |
|---|---|---|
| 3,282,875 A | 11/1966 | Connolly et al. |
| 3,784,399 A | 1/1974 | Grot |
| 3,849,458 A | 11/1974 | Dinh |
| 4,321,114 A | 3/1982 | MacDiarmid et al. |
| 4,356,429 A | 10/1982 | Tang |
| 4,358,545 A | 11/1982 | Ezzell et al. |
| 4,433,082 A | 2/1984 | Grot et al. |
| 4,442,187 A | 4/1984 | MacDiarmid et al. |
| 4,539,507 A | 9/1985 | VanSlyke et al. |
| 4,552,927 A | 11/1985 | Warren |
| 4,568,483 A | 2/1986 | Naarmann et al. |
| 4,731,408 A | 3/1988 | Jasne |
| 4,795,543 A | 1/1989 | Stetter et al. |
| 4,869,979 A | 9/1989 | Ohtani et al. |
| 4,889,659 A | 12/1989 | Genies |
| 4,933,106 A | 6/1990 | Sakai et al. |
| 4,940,525 A | 7/1990 | Ezzell |
| 4,959,430 A | 9/1990 | Jonas et al. |
| 4,973,391 A | 11/1990 | Madou et al. |
| 4,987,042 A | 1/1991 | Jonas et al. |
| 5,002,700 A | 3/1991 | Otagawa et al. |
| 5,035,926 A | 7/1991 | Jonas et al. |
| 5,066,731 A | 11/1991 | Feldhues et al. |
| 5,069,820 A | 12/1991 | Jen et al. |
| 5,115,057 A | 5/1992 | Ono et al. |
| 5,126,017 A | 6/1992 | Nakama et al. |
| 5,160,457 A | 11/1992 | Elsenbaumer et al. |
| 5,185,100 A | 2/1993 | Han et al. |
| 5,233,000 A | 8/1993 | Yodice et al. |
| 5,247,190 A | 9/1993 | Friend et al. |
| 5,254,633 A | 10/1993 | Han |
| 5,258,461 A | 11/1993 | Facci et al. |
| 5,281,363 A | 1/1994 | Shacklette et al. |
| 5,281,680 A | 1/1994 | Grot |
| 5,286,413 A | 2/1994 | Hannecart et al. |
| 5,294,504 A | 3/1994 | Otagawa et al. |
| 5,300,575 A | 4/1994 | Jonas et al. |
| 5,312,681 A | 5/1994 | Muys |
| 5,317,169 A | 5/1994 | Nakano et al. |
| 5,354,613 A | 10/1994 | Quintens et al. |
| 5,370,981 A | 12/1994 | Krafft et al. |
| 5,372,924 A | 12/1994 | Quintens |
| 5,378,402 A | 1/1995 | Cross et al. |
| 5,378,403 A | 1/1995 | Shacklette et al. |
| 5,408,109 A | 4/1995 | Heeger et al. |
| 5,463,005 A | 10/1995 | Desmarteau |
| 5,489,400 A | 2/1996 | Liu et al. |
| 5,537,000 A | 7/1996 | Alivisatos et al. |
| 5,554,179 A | 9/1996 | Stroetmann et al. |
| 5,567,356 A | 10/1996 | Kinlen |
| 5,578,249 A | 11/1996 | Ohtani et al. |
| 5,585,038 A | 12/1996 | Kirmanen et al. |
| 5,705,888 A | 1/1998 | Staring et al. |
| 5,716,550 A | 2/1998 | Gardner et al. |
| 5,723,873 A | 3/1998 | Yang |
| 5,766,515 A | 6/1998 | Jonas et al. |
| 5,773,150 A | 6/1998 | Tong et al. |
| 5,792,830 A | 8/1998 | Noding et al. |

(Continued)

FOREIGN PATENT DOCUMENTS

| CN | 1274869 A | 11/2000 |
|---|---|---|
| CN | 1276388 A | 12/2000 |

(Continued)

OTHER PUBLICATIONS

PCT International Search Report for International Application No. PCT/US2007/026512.
Extended European Search Report for Application No. EP10 01 2649; Rafael Kiebooms, Mar. 1, 2011.
EPO Official Action for Application No. 05725618.2; May 31, 2011.
EPO Official Action for Application No. 07863277.5, counterpart to U.S. Appl. No. 11/960,381; Mar. 7, 2013
EPO Official Action for Application No. EP 03770524.1, counterpart to U.S. Appl. No. 10/669,577; Feb. 25, 2010.
EPO Official Action for Application No. EP 06 774 120.7; Nov. 16, 2011.
EPO Official Letter regarding Application No. EP 05736268.3; Nov. 11, 2011.

(Continued)

*Primary Examiner* — Douglas McGinty

(57) ABSTRACT

Provided are compositions having high conductivity and high work-function. The compositions comprise an aqueous dispersion or solution of an electrically conducting polymer and a perfluorinated polymeric acid. The conductive polymers may be made from conjugated monomers or comonomers and a non-fluorinated polymeric acid, and the perfluorinated polymeric acides may be derived from perfluoroolefins having perfluoro-ether-sulfonic acid side chains. Devices embodying such compositions are also provided.

5 Claims, No Drawings

U.S. PATENT DOCUMENTS

| | | | |
|---|---|---|---|
| 5,798,170 A | 8/1998 | Zhang et al. |
| 5,863,465 A | 1/1999 | Kinlen |
| 5,869,350 A | 2/1999 | Heeger et al. |
| 5,910,385 A | 6/1999 | Gardner et al. |
| 5,911,918 A | 6/1999 | Shacklette et al. |
| 5,917,279 A | 6/1999 | Elschner et al. |
| 5,932,144 A | 8/1999 | Shimizu et al. |
| 5,965,281 A | 10/1999 | Cao |
| 5,986,400 A | 11/1999 | Staring et al. |
| 5,994,496 A | 11/1999 | Van Haare et al. |
| 6,004,483 A | 12/1999 | Jonas et al. |
| 6,018,018 A | 1/2000 | Samuelson et al. |
| 6,030,550 A | 2/2000 | Angelopoulos et al. |
| 6,083,635 A | 7/2000 | Jonas et al. |
| 6,097,147 A | 8/2000 | Baldo et al. |
| 6,136,909 A | 10/2000 | Liao et al. |
| 6,150,426 A | 11/2000 | Curtin et al. |
| 6,197,418 B1 | 3/2001 | Cloots et al. |
| 6,205,016 B1 | 3/2001 | Niu |
| 6,210,790 B1 | 4/2001 | Crivello |
| 6,225,040 B1 | 5/2001 | Muys et al. |
| RE37,370 E | 9/2001 | Cao |
| 6,303,238 B1 | 10/2001 | Thompson et al. |
| 6,303,943 B1 | 10/2001 | Yu et al. |
| 6,319,428 B1 | 11/2001 | Michot et al. |
| 6,324,091 B1 | 11/2001 | Gryko et al. |
| 6,337,370 B1 | 1/2002 | Bae et al. |
| 6,340,496 B1 | 1/2002 | Cloots et al. |
| 6,358,437 B1 | 3/2002 | Jonas et al. |
| 6,376,105 B1 | 4/2002 | Jonas et al. |
| 6,391,481 B1 | 5/2002 | Jonas et al. |
| 6,452,711 B1 | 9/2002 | Heuer et al. |
| 6,507,428 B1 | 1/2003 | Heuer et al. |
| 6,515,314 B1 | 2/2003 | Duggal et al. |
| 6,593,690 B1 | 7/2003 | McCormick et al. |
| 6,611,096 B1 | 8/2003 | McCormick et al. |
| 6,632,472 B2 | 10/2003 | Louwet et al. |
| 6,670,645 B2 | 12/2003 | Grushin et al. |
| 6,685,853 B1 | 2/2004 | Angelopoulos et al. |
| 6,706,963 B2 | 3/2004 | Gaudiana et al. |
| 6,710,123 B1 | 3/2004 | Amin-Sanayei |
| 6,713,567 B2 | 3/2004 | Bekiarian et al. |
| 6,717,358 B1 | 4/2004 | Liao et al. |
| 6,756,474 B2 | 6/2004 | Hsu |
| 6,759,441 B1 | 7/2004 | Kerres et al. |
| 6,777,515 B2 | 8/2004 | Bekiarian et al. |
| 6,830,828 B2 | 12/2004 | Thompson et al. |
| 6,875,523 B2 | 4/2005 | Grushin et al. |
| 6,923,881 B2 | 8/2005 | Tateishi et al. |
| 6,924,047 B2 | 8/2005 | Radu et al. |
| 6,955,772 B2 | 10/2005 | Van den Bogaert |
| 6,955,773 B2 | 10/2005 | Hsu |
| 6,963,005 B2 | 11/2005 | Lecloux et al. |
| 6,967,236 B1 | 11/2005 | Angelopoulos et al. |
| 7,071,289 B2 | 7/2006 | Sotzing |
| 7,112,369 B2 | 9/2006 | Wang et al. |
| 7,166,010 B2 | 1/2007 | Lamansky et al. |
| 7,189,771 B2 | 3/2007 | Hsu |
| 7,202,369 B2 | 4/2007 | Baik et al. |
| 7,211,202 B2 | 5/2007 | Korzhenko et al. |
| 7,211,824 B2 | 5/2007 | Lazarev |
| 7,244,797 B2 | 7/2007 | Kurihara et al. |
| 7,250,461 B2 | 7/2007 | Hsu et al. |
| 7,307,276 B2 | 12/2007 | Andriessen |
| 7,317,047 B2 | 1/2008 | Hsu |
| 7,318,982 B2 | 1/2008 | Gozdz et al. |
| 7,338,620 B2 | 3/2008 | Hsu et al. |
| 7,341,801 B2 | 3/2008 | Reuter et al. |
| 7,351,358 B2 | 4/2008 | Hsu et al. |
| 7,354,532 B2 | 4/2008 | Hsu et al. |
| 7,371,336 B2 | 5/2008 | Hsu et al. |
| 7,390,438 B2 | 6/2008 | Hsu et al. |
| 7,431,866 B2 | 10/2008 | Hsu et al. |
| 7,455,793 B2 | 11/2008 | Hsu et al. |
| 7,462,298 B2 | 12/2008 | Hsu et al. |
| 7,569,158 B2 | 8/2009 | Waller et al. |
| 7,593,004 B2 | 9/2009 | Spath et al. |
| 7,638,072 B2 | 12/2009 | Hsu et al. |
| 7,722,785 B2 | 5/2010 | Hsu et al. |
| 7,727,421 B2 * | 6/2010 | Hsu et al. ..................... 252/500 |
| 7,749,407 B2 | 7/2010 | Hsu et al. |
| 7,837,901 B2 | 11/2010 | Hsu et al. |
| 8,088,499 B1 | 1/2012 | Wang et al. |
| 2001/0016303 A1 | 8/2001 | Majumdar et al. |
| 2001/0019782 A1 | 9/2001 | Igarashi et al. |
| 2001/0038937 A1 | 11/2001 | Suzuki et al. |
| 2002/0009680 A1 | 1/2002 | Majumdar et al. |
| 2002/0017612 A1 | 2/2002 | Yu et al. |
| 2002/0038999 A1 | 4/2002 | Cao et al. |
| 2002/0041151 A1 | 4/2002 | Park et al. |
| 2002/0045713 A1 | 4/2002 | Feiring et al. |
| 2002/0076576 A1 | 6/2002 | Li |
| 2002/0098377 A1 | 7/2002 | Cao et al. |
| 2002/0099119 A1 | 7/2002 | Craig |
| 2002/0127381 A1 | 9/2002 | Will et al. |
| 2002/0132164 A1 | 9/2002 | Kaneko et al. |
| 2002/0136923 A1 | 9/2002 | Jonas et al. |
| 2002/0146442 A1 | 10/2002 | Sendelbach et al. |
| 2002/0190250 A1 | 12/2002 | Grushin et al. |
| 2002/0192476 A1 | 12/2002 | Kambe et al. |
| 2003/0008190 A1 | 1/2003 | Chisholm et al. |
| 2003/0020073 A1 | 1/2003 | Long et al. |
| 2003/0108771 A1 | 6/2003 | Lecloux et al. |
| 2003/0118829 A1 | 6/2003 | Hsu |
| 2003/0146436 A1 | 8/2003 | Parker et al. |
| 2003/0176628 A1 | 9/2003 | Groenendaal et al. |
| 2003/0213952 A1 | 11/2003 | Iechi et al. |
| 2003/0222250 A1 | 12/2003 | Hsu |
| 2003/0227001 A1 | 12/2003 | Li et al. |
| 2004/0009346 A1 | 1/2004 | Jang et al. |
| 2004/0010115 A1 | 1/2004 | Sotzing |
| 2004/0036067 A1 | 2/2004 | Andriessen |
| 2004/0044214 A1 | 3/2004 | Andriessen |
| 2004/0064152 A1 | 4/2004 | Zvuloni |
| 2004/0072987 A1 | 4/2004 | Groenendaal et al. |
| 2004/0092700 A1 | 5/2004 | Hsu |
| 2004/0097741 A1 | 5/2004 | Groenendaal et al. |
| 2004/0102577 A1 | 5/2004 | Hsu et al. |
| 2004/0124504 A1 | 7/2004 | Hsu |
| 2004/0126666 A1 | 7/2004 | Cao et al. |
| 2004/0127637 A1 | 7/2004 | Hsu et al. |
| 2004/0147765 A1 | 7/2004 | Baik et al. |
| 2004/0149952 A1 | 8/2004 | DePenning et al. |
| 2004/0149962 A1 | 8/2004 | Andriessen |
| 2004/0181011 A1 | 9/2004 | Korzhenko et al. |
| 2004/0206942 A1 | 10/2004 | Hsu |
| 2004/0214985 A1 | 10/2004 | Martin et al. |
| 2004/0217877 A1 | 11/2004 | Kokonaski et al. |
| 2004/0222413 A1 | 11/2004 | Hsu et al. |
| 2004/0254297 A1 | 12/2004 | Hsu et al. |
| 2004/0262599 A1 | 12/2004 | Bernds et al. |
| 2004/0266924 A1 | 12/2004 | Yang |
| 2005/0033015 A1 | 2/2005 | Pei |
| 2005/0035335 A1 | 2/2005 | Han et al. |
| 2005/0049319 A1 | 3/2005 | Stone et al. |
| 2005/0052027 A1 | 3/2005 | Priem |
| 2005/0059168 A1 | 3/2005 | Bazan |
| 2005/0064152 A1 | 3/2005 | Aylward et al. |
| 2005/0069726 A1 | 3/2005 | Douglas et al. |
| 2005/0070654 A1 | 3/2005 | Hsu |
| 2005/0089679 A1 | 4/2005 | Ittel et al. |
| 2005/0124784 A1 | 6/2005 | Sotzing |
| 2005/0175861 A1 | 8/2005 | Elschner et al. |
| 2005/0184287 A1 | 8/2005 | Herron et al. |
| 2005/0202274 A1 | 9/2005 | Elschner et al. |
| 2005/0205860 A1 | 9/2005 | Hsu et al. |
| 2005/0208328 A1 | 9/2005 | Hsu et al. |
| 2005/0209388 A1 | 9/2005 | Hsu et al. |
| 2005/0209392 A1 | 9/2005 | Luo et al. |
| 2005/0222333 A1 | 10/2005 | Hsu |
| 2005/0224765 A1 | 10/2005 | Hsu et al. |
| 2005/0224788 A1 | 10/2005 | Hsu et al. |
| 2005/0272214 A1 | 12/2005 | Chiang et al. |
| 2006/0051401 A1 | 3/2006 | Manohar |
| 2006/0076050 A1 | 4/2006 | Williams et al. |
| 2006/0076557 A1 | 4/2006 | Waller et al. |
| 2006/0076577 A1 | 4/2006 | Boos et al. |

| | | | | | | |
|---|---|---|---|---|---|---|
| 2006/0113510 | A1 | 6/2006 | Luo et al. | EP | 1726051 A1 | 11/2006 |
| 2006/0180810 | A1 | 8/2006 | Lee et al. | EP | 1730212 A1 | 12/2006 |
| 2006/0202171 | A1 | 9/2006 | Yoshida et al. | EP | 1 810 986 A2 | 7/2007 |
| 2006/0274049 | A1 | 12/2006 | Spath et al. | FR | 2632979 A1 | 12/1989 |
| 2006/0289843 | A1 | 12/2006 | Hsu et al. | GB | 2124635 A | 2/1984 |
| 2006/0292362 | A1 | 12/2006 | Hsu et al. | JP | 62119237 A | 5/1987 |
| 2007/0045591 | A1* | 3/2007 | Hsu et al. ............... 252/500 | JP | 62138582 A | 6/1987 |
| 2007/0066755 | A1 | 3/2007 | Hsu et al. | JP | 62164717 A | 7/1987 |
| 2007/0069184 | A1 | 3/2007 | Hsu et al. | JP | 63135453 A | 6/1988 |
| 2007/0069185 | A1 | 3/2007 | Hsu et al. | JP | 63215772 A | 9/1988 |
| 2007/0096082 | A1 | 5/2007 | Gaynor et al. | JP | 64065123 A | 3/1989 |
| 2007/0129534 | A1 | 6/2007 | Ohata et al. | JP | 01138237 U | 9/1989 |
| 2007/0172702 | A1 | 7/2007 | Elschner et al. | JP | 02160823 A | 6/1990 |
| 2007/0215864 | A1 | 9/2007 | Luebben et al. | JP | 02209931 A | 8/1990 |
| 2008/0023676 | A1 | 1/2008 | Hsu | JP | 02249221 A | 10/1990 |
| 2008/0128662 | A1 | 6/2008 | Hsu et al. | JP | 04234453 A | 8/1992 |
| 2008/0135809 | A1 | 6/2008 | Hsu | JP | 04306230 A | 10/1992 |
| 2008/0191172 | A1 | 8/2008 | Hsu | JP | 05129162 A | 5/1993 |
| 2008/0191614 | A1 | 8/2008 | Kim et al. | JP | 05255576 A | 10/1993 |
| 2008/0193773 | A1 | 8/2008 | Hsu et al. | JP | 05262981 A | 10/1993 |
| 2008/0210910 | A1 | 9/2008 | Hsu et al. | JP | 06073271 A | 3/1994 |
| 2008/0213594 | A1 | 9/2008 | Hsu | JP | 06264024 A | 9/1994 |
| 2008/0248314 | A1 | 10/2008 | Hsu et al. | JP | 06306280 A | 11/1994 |
| 2008/0251768 | A1 | 10/2008 | Hsu et al. | JP | 06313038 A | 11/1994 |
| 2008/0258605 | A1 | 10/2008 | Yukinobu | JP | 07010973 A | 1/1995 |
| 2008/0283800 | A1 | 11/2008 | Hsu | JP | 07090060 A | 4/1995 |
| 2008/0286605 | A1 | 11/2008 | Takeda | JP | 07157549 A | 6/1995 |
| 2008/0296536 | A1 | 12/2008 | Hsu et al. | JP | 07165892 A | 6/1995 |
| 2009/0008609 | A1 | 1/2009 | Yeisley et al. | JP | 08048850 A | 2/1996 |
| 2009/0072201 | A1 | 3/2009 | Hsu et al. | JP | 08048858 A | 2/1996 |
| 2009/0114884 | A1 | 5/2009 | Hsu | JP | 09176310 A | 7/1997 |
| 2009/0154059 | A1 | 6/2009 | Wessling et al. | JP | 10261418 A | 9/1998 |
| 2009/0318710 | A1 | 12/2009 | Brassat et al. | JP | 10509751 A | 9/1998 |
| 2010/0127222 | A1* | 5/2010 | Hsu et al. ............... 252/503 | JP | 11186103 A | 7/1999 |
| | | | | JP | 11353934 A | 12/1999 |
| FOREIGN PATENT DOCUMENTS | | | | JP | 2000091081 A | 3/2000 |
| CN | 1439029 A | | 8/2003 | JP | 2000505249 A | 4/2000 |
| CN | 1934725 A | | 3/2007 | JP | 2000336154 A | 12/2000 |
| DE | 2029556 A1 | | 12/1971 | JP | 2001006878 A | 1/2001 |
| DE | 3938094 A1 | | 5/1991 | JP | 2001035276 A | 2/2001 |
| DE | 4211459 A1 | | 10/1993 | JP | 2001106782 A | 4/2001 |
| DE | 4334390 A1 | | 4/1995 | JP | 2001504872 A | 4/2001 |
| DE | 10018750 A1 | | 1/2001 | JP | 2001270999 A | 10/2001 |
| DE | 102004006583 A1 | | 9/2005 | JP | 2001325831 A | 11/2001 |
| DE | 102004010811 A1 | | 9/2005 | JP | 2002500408 A | 1/2002 |
| EP | 245987 A2 | | 10/1991 | JP | 2002505356 A | 2/2002 |
| EP | 560721 A2 | | 9/1993 | JP | 2002082082 A | 3/2002 |
| EP | 269090 A1 | | 2/1994 | JP | 2002246177 A | 8/2002 |
| EP | 356239 A2 | | 2/1995 | JP | 2002293888 A | 10/2002 |
| EP | 517379 A1 | | 6/1995 | JP | 2003040856 A | 2/2003 |
| EP | 361322 A2 | | 11/1995 | JP | 2003158043 A | 5/2003 |
| EP | 440957 A2 | | 3/1996 | JP | 2003187983 A | 7/2003 |
| EP | 488321 A1 | | 10/1997 | JP | 2003217862 A | 7/2003 |
| EP | 817540 A2 | | 1/1998 | JP | 2003261749 A | 9/2003 |
| EP | 828184 A1 | | 3/1998 | JP | 2003264083 A | 9/2003 |
| EP | 593111 A1 | | 6/1998 | JP | 2003297582 A | 10/2003 |
| EP | 1026152 A1 | | 8/2000 | JP | 2003301116 A | 10/2003 |
| EP | 1079397 A1 | | 2/2001 | JP | 2004500449 A | 1/2004 |
| EP | 761691 A2 | | 1/2002 | JP | 2004501494 T | 1/2004 |
| EP | 1191612 A2 | | 3/2002 | JP | 2004502004 A | 1/2004 |
| EP | 1191614 A2 | | 3/2002 | JP | 2004082395 A | 3/2004 |
| EP | 1227529 A2 | | 7/2002 | JP | 2004099678 A | 4/2004 |
| EP | 1231251 A1 | | 8/2002 | JP | 2004107552 A | 4/2004 |
| EP | 1286569 A1 | | 2/2003 | JP | 2004197095 U | 7/2004 |
| EP | 1054414 A1 | | 3/2003 | JP | 2004231939 A | 8/2004 |
| EP | 1061530 A1 | | 3/2003 | JP | 2004523623 A | 8/2004 |
| EP | 962943 A1 | | 12/2003 | JP | 2004532307 A | 10/2004 |
| EP | 1371709 A1 | | 12/2003 | JP | 2004534892 A | 11/2004 |
| EP | 1384739 A1 | | 1/2004 | JP | 2004537612 A | 12/2004 |
| EP | 1408563 A2 | | 4/2004 | JP | 2005108504 A | 4/2005 |
| EP | 1428857 A1 | | 6/2004 | JP | 2005120363 A | 5/2005 |
| EP | 949283 A1 | | 4/2005 | JP | 2005139376 A | 6/2005 |
| EP | 949308 A1 | | 4/2005 | JP | 2005145987 A | 6/2005 |
| EP | 1 564 251 B1 | | 6/2005 | JP | 2005226072 A | 8/2005 |
| EP | 1546237 A2 | | 6/2005 | JP | 2005232452 A | 9/2005 |
| EP | 1564250 A1 | | 8/2005 | JP | 2005536595 A | 12/2005 |
| EP | 1564251 A1 | | 8/2005 | JP | 2005537348 A | 12/2005 |
| EP | 1615971 A2 | | 1/2006 | JP | 2006500461 A | 1/2006 |
| EP | 1647566 A2 | | 4/2006 | JP | 2006500463 A | 1/2006 |

| | | | |
|---|---|---|---|
| JP | 2006502254 A | 1/2006 |
| JP | 2006108064 A | 4/2006 |
| JP | 2006515315 A | 5/2006 |
| JP | 2006152251 A | 6/2006 |
| JP | 2006225658 A | 8/2006 |
| JP | 2006527277 A | 11/2006 |
| JP | 2007502531 A | 2/2007 |
| JP | 2007191715 A | 8/2007 |
| JP | 2007529607 A | 10/2007 |
| JP | 2007531802 A | 11/2007 |
| JP | 2008546898 A | 12/2008 |
| JP | 2008546899 A | 12/2008 |
| JP | 2008546900 A | 12/2008 |
| JP | 2008547185 A | 12/2008 |
| JP | 2009502025 A | 1/2009 |
| JP | 2009270117 A | 11/2009 |
| JP | 2010534739 A | 11/2010 |
| KR | 20030096385 | 12/2003 |
| KR | 100613311 B1 | 8/2006 |
| RU | 2035803 C1 | 5/1995 |
| TW | 463524 B | 11/2001 |
| TW | 505927 B | 10/2002 |
| TW | 200304238 | 9/2003 |
| TW | I327152 | 7/2010 |
| WO | 9305519 A1 | 3/1993 |
| WO | 9801909 A1 | 1/1998 |
| WO | 9831716 A1 | 7/1998 |
| WO | 9934371 A1 | 7/1999 |
| WO | 9945048 A1 | 9/1999 |
| WO | 9952954 A1 | 10/1999 |
| WO | 0070655 A2 | 11/2000 |
| WO | 0138219 A1 | 5/2001 |
| WO | 0141230 A1 | 6/2001 |
| WO | 0141512 A1 | 6/2001 |
| WO | 0199192 A2 | 12/2001 |
| WO | 0199207 A2 | 12/2001 |
| WO | 0200759 A1 | 1/2002 |
| WO | 0202714 A2 | 1/2002 |
| WO | 0205354 A1 | 1/2002 |
| WO | 0215645 A1 | 2/2002 |
| WO | 0242352 A2 | 5/2002 |
| WO | 02065484 A1 | 8/2002 |
| WO | 02079316 A2 | 10/2002 |
| WO | 02080627 A2 | 10/2002 |
| WO | 02092646 A1 | 11/2002 |
| WO | 02099907 A1 | 12/2002 |
| WO | 03006515 A1 | 1/2003 |
| WO | 03006537 A1 | 1/2003 |
| WO | 03008424 A1 | 1/2003 |
| WO | 03012908 A2 | 2/2003 |
| WO | 03040257 A1 | 5/2003 |
| WO | 03046540 A1 | 6/2003 |
| WO | 03048228 A1 | 6/2003 |
| WO | 03050824 A1 | 6/2003 |
| WO | 03063555 A1 | 7/2003 |
| WO | 03074601 A2 | 9/2003 |
| WO | 03091688 A2 | 11/2003 |
| WO | 2004016710 A1 | 2/2004 |
| WO | 2004018544 A1 | 3/2004 |
| WO | 2004019345 A1 | 3/2004 |
| WO | 2004020444 A1 | 3/2004 |
| WO | 2004020502 A1 | 3/2004 |
| WO | 2004029128 A2 | 4/2004 |
| WO | 2004029133 A1 | 4/2004 |
| WO | 2004029176 A1 | 4/2004 |
| WO | 2004031192 A1 | 4/2004 |
| WO | 2004094501 A2 | 11/2004 |
| WO | WO 2004/094501 A2 | 11/2004 |
| WO | 2004105150 A1 | 12/2004 |
| WO | 2004106404 A1 | 12/2004 |
| WO | 2004106409 A1 | 12/2004 |
| WO | 2005003083 A1 | 1/2005 |
| WO | 2005018012 A1 | 2/2005 |
| WO | 2005024853 A1 | 3/2005 |
| WO | 2005041217 A1 | 5/2005 |
| WO | 2005052027 A1 | 6/2005 |
| WO | 2005080525 A2 | 9/2005 |
| WO | 2005090434 A1 | 9/2005 |
| WO | 2005090435 A1 | 9/2005 |
| WO | 2005090436 A1 | 9/2005 |
| WO | 2005093872 A1 | 10/2005 |
| WO | WO 2005/098872 A2 | 10/2005 |
| WO | 2005121217 A1 | 12/2005 |
| WO | 2006073968 A2 | 7/2006 |
| WO | 2006078264 A2 | 7/2006 |
| WO | 2007002681 A2 | 1/2007 |
| WO | 2007002682 A2 | 1/2007 |
| WO | 2007002683 A2 | 1/2007 |
| WO | 2007002737 A2 | 1/2007 |
| WO | 2007002740 A2 | 1/2007 |
| WO | WO 2007/002681 A2 | 1/2007 |
| WO | 2007092296 A2 | 8/2007 |
| WO | 2007120143 A1 | 10/2007 |
| WO | 2009018009 A1 | 2/2009 |

OTHER PUBLICATIONS

PCT International Search Report for Application No. PCT/US2003/030512, counterpart to U.S. Appl. No. 10/669,577; R. Kiebooms Authorized Officer, Feb. 19, 2004.

PCT International Search Report for International Application No. PCT/US2003/030026; R. Kiebooms Authorized Officer, Mar. 24, 2004.

PCT International Search Report for International Application No. PCT/US2004/012564, counterpart to U.S. Appl. No. 10/802,704; R. Kiebooms, Authorized Officer; Jan. 14, 2005.

PCT International Search Report for Application No. PCT/US2005/008563; R. Kiebooms, Authorized Officer; Jun. 17, 2005.

PCT International Search Report for Application No. PCT/US2005/012461, counterpart to U.S. Appl. No. 10/823,320; C. Meiners, Authorized Officer; Jul. 29, 2005.

PCT International Search Report for International Application No. PCT/US2005/008764, counterpart to U.S. Appl. No. 10/803,114; F. Rousseau, Authorized Officer; Aug. 3, 2005.

PCT International Search Report for International Application No. PCT/US2006/25013; Lee W. Young, Authorized Officer; Jan. 16, 2007.

PCT International Search Report for International Application No. PCT/US2006/25013, counterpart to U.S. Appl. No. 11/475,715; Lee W. Young, Authorized Officer; Jan. 16, 2007.

PCT International Search Report for International Application No. PCT/US2006/025014, counterpart to U.S. Appl. No. 11/475,710; Lee W. Young, Authorized Officer; Jul. 25, 2007.

PCT International Search Report for International Application No. PCT/US2006/025012, counterpart to U.S. Appl. No. 11/475,702; Lee W. Young, Authorized Officer; ISA/US; Oct. 26, 2007.

PCT International Search Report for International Application No. PCT/US2007/015323, counterpart to U.S. Appl. No. 11/770,822; D. Marsitzky Authorized Officer; Dec. 18, 2007.

PCT International Search Report for Application No. PCT/US2007/026438, counterpart to U.S. Appl. No. 11/960,381; Dirk Marsitzky, Authorized Officer; Apr. 22, 2008.

PCT International Search Report for Application No. PCT/US2008/070718, counterpart to U.S. Appl. No. 12/177,359; Benedikt Schlicke, Authorized Officer; Oct. 31, 2008.

PCT International Search Report for Application No. PCT/US2009/035079; Lee W. Young, Authorized Officer; Apr. 9, 2009.

PCT International Search Report for Application No. PCT/US2010/061680, counterpart to U.S. Appl. No. 12/643,556; KIPO; Sep. 29, 2011.

Opposition Against EP 1 546 237 B1, H. C. Starck Clevios GmbH, Goslar, Germany, May 13, 2009 (English Translation).

Opposition Against EP 1 546 237 B1, H. C. Starck Clevios GmbH, Goslar, Germany, May 13, 2009 (German Original).

Opposition Against EP 1 546 237 B1, E. I. du Pont de Nemours and Company, Wilmington, Delaware, Observations of the Patent Proprietor, Mar. 1, 2010.

Opposition Against EP 1 546 237 B1, E. I. du Pont de Nemours and Company, Wilmington, Delaware, Observations of the Patent Proprietor, Mar. 1, 2010, Annex, Declaration of Dr Hjalti Skulason dated Feb. 24, 2010.

Opposition Against EP 1 546 237 B1, E. I. du Pont de Nemours and Company, Wilmington, Delaware, Observations of the Patent Proprietor, Mar. 1, 2010, Annex, Experimental Data, Sep. 21-Oct. 6, 2009.

Opposition Against EP 1 546 237; Decision Revoking European Patent; EPO Opposition Division; Dec. 8, 2011.
Opposition Against EP 1 546 237 B1; Patentee's Grounds for Appeal; Apr. 18, 2012.
Opposition Against EP 1546237: Proposed Main Request—Claims; Apr. 2012.
Opposition Against EP 1546237: First Auxiliary Request—Claims; Apr. 18, 2012.
Opposition Against EP 1546237: Second Auxiliary Request—Claims; Apr. 18, 2012.
Opposition Against EP 1546237: Third Auxiliary Request—Claims; Apr. 18, 2012.
Opposition Against EP 1546237: Fourth Auxiliary Request—Claims; Apr. 18, 2012.
Opposition Against EP 1546237: Fifth Auxiliary Request—Claims; Apr. 18, 2012.
Opposition Against EP 1546237; Declaration of Hjalti Skulason; Apr. 30, 2012.
Opposition Against EP 1615971 B1, H. C. Starck Clevios GmbH, Goslar, Germany, Mar. 2, 2010 (English Translation).
Opposition Against EP 1615971 B1, H. C. Starck Clevios GmbH, Goslar, Germany, Mar. 2, 2010 (German Original).
Opposition Against EP 1615971; Summons to Oral Proceedings before the EPO; Sep. 19, 2011.
Opposition Against EP 1615971; Observations of the Patent Proprietor; Dec. 6, 2011.
Opposition Against EP 1615971; Main Request—Claims; Nov. 24, 2011.
Opposition Against EP 1615971; First Auxiliary Request—Claims; Dec. 6, 2011.
Opposition Against EP 1615971; Second Auxiliary Request—Claims; Dec. 6, 2011.
Opposition Against EP 1615971; Third Auxiliary Request—Claims; Dec. 6, 2011.
Opposition Against EP 1615971; Fourth Auxiliary Request—Claims; Dec. 6, 2011.
Opposition Against EP 1615971; Fifth Auxiliary Request—Claims; Dec. 6, 2011.
Opposition Against EP 1615971; Letter from Opponent; Dec. 22, 2011 (English Translation).
Opposition Against EP 1615971; Grounds of Appeal of the Opposition; Appeal No. T1708/12-3.4.02; Sep. 27, 2012 (English Trans).
Opposition Against EP 1615971; Grounds of Appeal of the Opposition; Appeal No. T1708/12-3.4.02; Sep. 27, 2012 (German Original).
Opposition Against EP 1615971; Grounds of Appeal of the Patentee; Appeal No. T1708/12-3.4.02; Sep. 28, 2012.
"DuPont Fuel Cells—DuPont Nafion PFSA Membranes NE-1135, N-115, N-117, NE-1110," Jan. 1, 2005, pp. 1-4.
"Colloid," Definition from IUPAC Gold Book, Apr. 17, 2012.
"Colloid," Wikipedia entry, Nov. 4, 2012.
"Conductive Polymer," Definition from WIKIPEDIA, The Free Encyclopedia (Date unknown).
"Dispersion Chemistry", Wikipedia entry, Nov. 4, 2012.
Agibalova et al., "Supramolecular Organization of Polyfluorinated Copolymers in Solutions," Polymer Science, Ser. A, 1998, vol. 40, No. 6, pp. 615-621 (Translated from Vysokomolkuyarnye Soedineniya, Seriya A I Seriya B, 40 [6], pp. 1009-1016, 1998).
Aldrich Catalog, Germany; 1994-95; p. 1137; as evidence of product with catalog No. 27,740-4.
Aleshin et al., "Transport Properties of Poly(3,4-ethylenedioxythiophene)/poly(styrenesulfonate)," Synthetic Metals, 1998, vol. 94, pp. 173-177.
Angelopoulos et al., "Polyaniline: Solutions, Films and Oxidation State," Molecular Crystals and Liquid Crystals, 1988, vol. 160, pp. 151-163.
Appleby et al., "Polymeric Perfluoro Bis-Sulfonomides as Possible Fuel Cell Electrolytes," Journal of the Electrochemical Society, 1993, vol. 140, No. 1, pp. 109-111.
Arnautov et al., "New Dopant-Solvent System for Conductive PAN Films Production," Synthetic Metals, 1997, vol. 84, No. 1-3, pp. 133-134, Elsevier Science S.A.
ASTM, Standard Practice for Testing the Shelf Life of Ink Jet Printer Cartridges (Date unknown).

Barthet et al., "Aspects of the Conducting Properties of Nafion Doped Polyaniline", Electrochimica Acta, 1996, vol. 41, No. 18, pp. 2791-2798.
Barthet et al., "Mixed electronic and ionic conductors: a new route to Nafion-doped polyaniline" in Journal of Electroanalytical Chemistry, 1995, vol. 388, pp. 45-44.
Baytron Coating Guide Issue Oct. 2002—Obtained From www.hcstarck-echemicals.com.
Baytron H. C. Stark GmbH (Brochure) No Date.
Baytron P VAP A1 4083 and Baytron P VP CH 8000 Product Information for Electronic Grades Designed For Use As Hole-Injection Material in OLEDS—Obtained From www.hcstarckechemicals.com.
Baytron Product info from baytron.com; Aug. 1, 2007.
Bharathan et al., "Polymer/metal Interfaces and the Performance of Polymer Light-Emitting Diodes, " Journal of Applied Physics, 1998, vol. 84(6), pp. 3207-3211.
Boix et al., "Efficient H-D Exchange of Aromatic Compounds in Near-Critical D20 Catalysed by a Polymer-Supported Sulphonic Acid," Tetrahedron Letters 40, 1999, pp. 4433-4436.
Brown et al, "Built-in field electroabsorbtion spectroscopy of plymer light-emitting diodes incorporating a doped poly (3,4-ethylene dioxythiophene) hole injection layer," Applied Physics Letters, AIP, American Institute of Physics, 1999, vol. 75, No. 12, pp. 1679-1681.
Campbell, I.H. et al., "Excitation Transfer Processes in a Phosphor-Doped Poly 9p-phenylene vinylene) Light-Emitting Diode," Physical Review B., vol. 65, 085210-1-085210-8.
Caras-Quintero et al., "Efficient Synthesis of 3,4-ethylenedioxythiophenes by Mitsunobu Reaction" Chemical Communications, Chemcom, Royal Society of Chemistry, GB, vol. 22, Nov. 4, 2002, pp. 2690-2691.
Caras-Quintero et al., "Synthesis of the First Enantiomerically Pure and Chiral, Disubstituted 3,4ethylenedioxythiophenes (EDOTs) and Corresponding Stereo- and Regioregular PEDOTs," Chemical Communication, 2004, pp. 926-927.
CAS reg. No. 126213-51-2, Apr. 6, 1990 [Chemical registry].
CAS reg. No. 31175-20-9, Nov. 16, 1984 [chemical registry].
Cassel et al., "Original Synthesis of Linear, Branched and Cyclic Oligoglycerol Standards," European Journal of Organic Chemistry, 2001, No. 5, pp. 875-896.
Cen et al., "1,1,2,2-Tetrafluoro-2-(polyfluoroalkoxy)ethanesulfonic Acids, 1,1,2,2-Tetrafluoro-2-(perfluoroalkoxy) ethanesulfonic Acids, and 2,2'-Oxybis(1,1,2,2-tetrafluoroethanesulfonic acid)," Inorganic Chemistry, 1988, vol. 27, pp. 1376-1377, American Chemical Society.
Colvin et al., "Light-Emitting Diodes Made from Cadmium Selenide Nanocrystals and a Semiconducting Polymer," Nature, 1994, vol. 370, pp. 354-357.
Constantini et al., "Infrared Spectroscopic Study of Polaron Formation in Electrochemically Synthesized Poly(3-alkylpyrroles)," Phys. Chem. Chem. Phys.,2003 vol. 5, pp. 749-757.
Desmarteau, Novel Periluoinated lonomers and lonenes, Journal of Fluorine Chemistry, 1995, vol. 72, pp. 203-208.
Downs et al., "Efficient Polymerization of Aniline at Carbon Nanotube Electrodes", Advanced Materials, 1999, vol. 11, No. 12, pp. 1028-1031.
England et al; "Nucleophilic Reactions of Fluoro-olefins," Journal of American Chemical Society (1960) v. 82, p. 5116.
Esaki et al., "Efficient H/D Exchange Reactions of Alkyl-Substituted Benzene Derivatives by Means of the Pd/C-H2-D20 System," Chemistry: A European Journal, 2007, vol. 13, pp. 4052-4063.
Feiring et al., "Aromatic Monomers with Pendant Fluoroalkylsulfonate and Sulfonimide Groups," Journal of Fluorine Chemistry, 2000, vol. 105, No. 1, pp. 129-135.
Feiring et al., "Novel Aromatic Polymers with Pendant Lithium Periluoroalkylsulfonate or Sulfinimide Groups," Macromolecules, 2000, vol. 33, pp. 9262-9271.
Fowler et al., "Hydrogen detection by Polyaniline nanofibers on gold and platinum electrodes", The Journal of Physical Chemistry C, 2001, vol. 113, No. 16, pp. 6444-6449.
Gao et al., "Soluble polypyrrole as the transparent anode in polymer light-emitting diodes," Synthetic Metals, 1996, vol. 82, pp. 221-223, 82, Elsevier Science S.A.

Guo et al., "Aromatic H/D Exchange Reaction Catalyzed by Groups 5 and 6 Metal Chlorides," Chinese Journal of Chemistry, 2005, vol. 23, pp. 341-344.

Gustafsson et al., "Flexible Light-Emitting Diodes Made from Soluble Conducting Polymers," Nature, 1992, vol. 357, pp. 477-479.

Hackley et al., The Use of Nomenclature in Dispersion Science and Technology, NIST, Aug. 2001, pp. 2-4, 10, 11.

Hansen et al., "Work Function Measurements in Gas Ambient," Surface Science, 1994, vol. 316, pp. 372-382.

Hirai et al; "Electrochemical Behaviors of Polypyrrole, Poly-3-Methyl-thiophene, and Polyaniline Deposited on NafionCoated Electrodes," Journal of the Electrochemical Society, vol. 135, No. 5, 1 May 1988, pp. 1132-1137, Electrochemical Society, Manchester, NH.

Hong et al, "Association of Nafion with Polypyrrole Nanoparticles in a Hydrophilic Polymer Network: Effects on Proton Transport," Journal of Colloid and Interface Science, 1999, vol. 218 pp. 233-242.

Hsu, "Novel Preparation and Properties of Conductive Polyaniline/Nafion® Film," Synthetic Metals, 1991, vol. 41-43, pp. 671-674.

Huang et al., "Well-Dispersed Single-Walled Carbon Nanotube/Polyaniline Composite Films," Carbon, vol. 41, 2003, pp. 2731-2736.

Iijima et al., Single-Shell Carbon Nanotube of 1-nm Diameter, Nature, 1993, vol. 363, pp. 603-605.

Ivanov et al., "The Study of Carbon Nanotubules Produced by Catalytic Method," Chemical Physics Letters, 1994, vol. 223, pp. 329-335.

Jiang et al., "Preparation of a Nafion Composite Membrane using a Porous Teflon Support," Journal of Membrane Science, Elsevier Scientific Publ. Co., Amsterdam, NL, vol. 132, No. 2, Sep. 3, 1997, pp. 273-276.

Jong et al., "Stability of the Interface between Indium-tin-oxide and Poly(3,4-ethylenedioxythiophene)/poly (styrenesulfonate) in Polymer Light-Emitting Diodes," Applied Physics Letters, 2000, vol. 77, No. 14, pp. 2255-2257.

Journet et al., "Large-Scale Production of Single-Walled Carbon Nanotubes by the Electric-Arc Technique," Nature, 1997, vol. 388, pp. 756-758.

Kim et al., "Enhancement of Electrical Conductivity of Poly(3,4-ethylenedioxythiophene)/Poly(4-styrenesulfonate) by a Change of Solvents," Synthetic Metals, 2002, vol. 126, No. 2/3, pp. 311-316.

Kitani et al., "Properties of Elastic Polyaniline," Synthetic Metals, 1997, vol. 84, No. 1-3, pp. 83-84, Elsevier Science S.A.

Laha, S.C. et al., "Highly Selective Epoxidation of Olefinic Compounds Over TS-1 and TS-2 Redox Molecular Sieves using Anhydrous Urea-Hydrogen Peroxide as Oxidizing Agent," Journal of Catalysis, 2002, 208(2), 339-344.

Lee et al., Poly(thieno(3,4-b)thiophene) A New Stable Low Band Gap Conducting Polymer, Macromolecules, 2001, vol. 34, pp. 5746-5747.

Lefebvre et al., "Chemical Synthesis, Characterization, and Electrochemical Studies of Poly(3,4-ethylenedioxythiophene)/Poly(styrene-4-sulfonate) Composites," Chem. Mater., 1999, vol. 11, pp. 262-268, American Chemical Society.

Levi et al., "Polymer and Cathode Emission Studies of Polymer-Based Light-Emitting Diodes Under Strong Electrical Pulse Excitation," Journal of Applied Physics, 2000, vol. 88, No. 5, pp. 2548-2552.

Lewis, Hawley's Condensed Chemical Dictionary, 12th Ed., 1993, pp. 300-301.

Li et al., "Large-Scale Synthesis of Aligned Carbon Nanotubes," Science, 1996, vol. 274, pp. 1701-1703.

Lim et al., "Degradation of Organic Light-Emitting Devices Due to Formation and Growth of Dark Spots," Materials Science and Engineering, 2001, pp. 154-159.

Lima, A., "Electropolymerization of and 3,4-ethylenedioxtyiophene and 3,4-Ethylenedioxythiophene Methanol in the Persence of Dodecylbenezenesulfonate," Synthetic Metals, 1998, 93, 33-41.

Madler et al., "Visibly Transparent and Radiopaque Inorganic Organic Composites from Flame-Made Mixed-Oxide Fillers," Journal of Nanoparticle Research, 2005, vol. 8, No. 3-4, pp. 323-333.

Markus et al., Electronics and Nucleonics Dictionary, pp. 470-471 & 476 (McGraw-Hill 1966).

Marrion, "Binders for Waterborne Coatings," The Chemistry and Physics of Coatings, Second Edition, 2004.

Moeller et al., "A Polymer/Semiconductor Write-Once Read-Many-Times Memory," Nature, 2003, vol. 426, pp. 166-169.

Morrison & Boyd, Organic Chemistry, 6th Ed., 1994, pp. 312-317 (First Half).

Nafion Definition; Wikipedia; 20090513 (German).

Nafion Definition; Wikipedia; 20100218 (English).

O'Brien et al., "Electrophosphorescence From a Doped Polymer Light Emitting Diode," Synthetic Metals, 2001, vol. 116(1-3), pp. 379-383.

Pickup et al., "Electronically conducting cation-exchange polymer powders: synthesis, characterization and applications in PEM fuel cells and supercapacitors," Journal of New Materials for Electrochemical Systems, vol. 3, 2000, pp. 21-26.

Qi et al., "Size Control of Polypyrrole Particles," Chem. Mater., 1997, vol. 9, pp. 2934-2939, American Chemical Society.

Riedel et al., "Tailored Highly Transparent Composite Hole-Injection Layer Consisting of Pedot:PSS and SiO2 Nanoparticles for Efficient Polymer Light-Emitting Diodes," Advanced Materials, 2011, vol. 23, pp. 740-745.

Römpp Chemistry Dictionary, 9th Edition, 1993, pp. 2459-2460 (German and English Translation).

Sajiki et al., "Efficient C-H/C-D Exchange Reaction on the Alkyl Side Chain of Aromatic Compounds Using Heterogeneous Pd/C in D2O," Org. Lett., 2004, vol. 6(9), pp. 1485-1487.

Schottland P. et al., "Synthesis and Polymerization of New Monomers Derived From 3, 4-Ethylenedioxythiophene" Journal De Chimie Physique, Societe De Chimie Physique, Paris, Fr. vol. 95, No. 6, Jan. 1, 1998, pp. 1258-1261.

Schroedner et al., "Organische Feldeffekttransisoren auf Basis Halbleitender Polymere/Organic Field-Effect Transistors Based on Semiconducting Polymers," Electrotechnik and Informationstechnik, Springer Verlag, 2003, vol. 120, No. 6, pp. 205-209 (German Original and English Translation).

Schwendeman et al; "Perfluoroalkanoate-substituted PEDOT for Electronic Device Applications," Advanced Functional Materials, vol. 13, No. 7, 2003, pp. 541-547.

Segura, J.L., et al., "Synthesis and Electropolymerization of a Perylenebisimide-Functionalized 3, 4-Ethylenedioxythiophene Derivative," Organic Letters, vol. 7, No. 12, 2005, pp. 2345-2348.

Sharpe et al., "Improved Cationic Conductive Polymer," Calgon Corp. Coating Conference (Proceeding), 1981, pp. 83-87.

Simpson et al., "Advances and Applications of Inherently Conductive Polymer Technologies Based on Poly(3,4-Ethylenedioxythiophene)," 2005 AIMCAL Fall Technical Conference.

Sotzing et al., "Poly(thieno(3,4-b)thiophene): A p- and n-Dopable Polythiophene Exhibiting High Optical Transparency in the Semiconducting State," Macromolecules, 2002, vol. 35, pp. 7281-7286.

Stejskal et al., "Polyaniline Dispersions 10. Coloured Microparticles of Variable Density Prepared Using Stabilizer Mixtures," Colloid Polymer Science, vol. 278, 2000, pp. 654-658.

Sun et al, "Catalytic Oxidation Polymerization of Aniline in an H2O2-Fe2+ System," Journal of Applied Polymer Science, 1999, vol. 72, pp. 1077-1084.

Sze, S.M., Physics of Semiconductor Devices, 2nd Edition, 1981, John Wiley & Sons, p. 492 Tang et al., "Organic/Inorganic Material for Coating on Metals," Materials Research Society Symp. Proc., vol. 734, 2003, pp. B.9.57.1-7.

Thelakkat et al., "Poly(triarylamine)s- Synthesis and Application in Electroluminescent Devices and Photovoltaics," Synthetic Metals, 1999, vol. 102, pp. 1125-1128.

Thess et al., "Crystalline Ropes of Metallic Carbon Nanotubes," Science, 1996, vol. 273, pp. 483-487.

Unknown, The Experimental Chemistry Course, 4th Ed., vol. 20, Organic Synthesis II—Alcohol and Amines, 1992, pp. 49-51 (Japanese Only).

Venturello, C. et al., "A Convenient Catalytic Method for the Dihydroxylation of Alkenes by Hydrogen Peroxide," Synthesis, 1989, 4, 295-297.

Wang, "Photoconductive Materials," Kirk-Othmer Encyclopedia of Chemical Technology, Fourth Edition, 1996, vol. 18, pp. 837-860.

Watts et al., "A novel deuterium effect on dual charge-transfer and ligand-field emission of the cis-dichlorobis(2,2'-bipyndine)iridium(III) ion," Journal of the American Chemical Society, 1979, vol. 101(10), pp. 2742-2743.

Wu et al., "Transparent, Conductive Carbon Nanotube Films," Science, 2004, vol. 305, pp. 1273-1276.

Yang et al., "The photoelectrochemical properties of TiO2 electrodes modified by quantum sized PbS and thiols", Synthetic Metals, 2001, vol. 123, No. 2, pp. 267-272.

Yuan et al., "Size and morphology effects of ZnO anode nanomaterials for Zn/Ni secondary batteries; Size and morphology effects of ZnO anode nanomaterials for Zn/Ni secondary batteries", Nanotechnology, 2005, vol. 16, No. 6, pp. 803-808.

Decision of the Boards of Appeal of the European Patent Office in Case No. T0860/93; Application No. 88115147.6; Dec. 29, 1993; Cited in the Opposition to Application No. EP 1546237.

Decision of the Boards of Appeal of the European Patent Office in Case No. T1078/93-3.3.5; Application No.90905154.2; Publication No. 0462216; Process for Improving the Physical and Catalytic Properties of a Fluid Cracking.Catalyst; Nov. 20, 1997; Cited in the Opposition to Application No. EP 1546237.

Decision of the Boards of Appeal of the European Patent Office in Case No. T0939/98-3.3.3; Application No. 95910871.3; Publication No. 0742800; Two-phase Acidic Aqueous Compositions for Diffusion Transfer Products; Jan. 17, 2002; Cited in the Opposition to Application No. EP 1546237.

Decision of the Boards of Appeal of the European Patent Office in Case No. T0114/06-3.3.02; Application No. 04013422.3; Publication No. 1452171; Pharmaceutical Liquid Suspensions; Jul. 29, 2008; Cited in the Opposition to Application No. EP 1546237.

Extended European Search Report for Application No. EP 0677120.7, counterpart to U.S. Appl. No. 11/475,702; Jan. 27, 2010.

European Search Report and Opinion for Application No. EP06785660, counterpart to U.S. Appl. No. 11/475,715; Munich, Germany; Feb. 4, 2010.

Extended European Search Report from EP 06774121.5, counterpart to U.S. Appl. No. 11/960,790; Feb. 12, 2010.

Opposition Against EP 1615971; (E9) Experimental Data: Effect of pH on Buffer Layer Materials Containing Co-Dispersing Liquids; Sep. 28, 2012.

Opposition Against EP 1615971; Main Request—Claims; Sep. 28, 2012.

Opposition Against EP 1615971; First Auxiliary Request—Claims; Sep. 28, 2012.

Opposition Against EP 1615971; Second Auxiliary Request—Claims; Sep. 28, 2012.

Opposition Against EP 1615971; Third Auxiliary Request—Claims; Sep. 28, 2012.

Opposition Against EP 1615971; Fourth Auxiliary Request—Claims; Sep. 28, 2012.

Opposition Against EP 1615971; Grounds of Complaint of the Opposition; Appeal No. T1708/12-3.4.02; Apr. 11, 2013 (English Machine Translation).

Opposition Against EP 1615971; Patentee's Response to the Appeal; Appeal No. T1708/12-3.3.03; Apr. 15, 2013.

Opposition Against EP 1615971; (E11) Experimental Data: Effect of Co-Dispersing Liquid on PEDOT Polymerization in the Presence of Nafion; Apr. 15, 2013.

Opposition Against EP 1615971; Main Request—Claims; Apr. 15, 2013.

Opposition Against EP 1615971; First Auxiliary Request—Claims; Apr. 15, 2013.

Opposition Against EP 1615971; Second Auxiliary Request—Claims; Apr. 15, 2013.

Opposition Against EP 1615971; Third Auxiliary Request—Claims; Apr. 15, 2013.

Opposition Against EP 1615971; Fourth Auxiliary Request—Claims; Apr. 15, 2013.

Opposition Against EP 1615971; Fifth Auxiliary Request—Claims; Apr. 15, 2013.

Opposition Against EP 1615971; Sixth Auxiliary Request—Claims; Apr. 15, 2013.

Opposition Against EP 1615971; Seventh Auxiliary Request—Claims; Apr. 15, 2013.

Opposition Against EP 1615971; Eighth Auxiliary Request—Claims; Apr. 15, 2013.

Opposition Against EP 1615971; Ninth Auxiliary Request—Claims; Apr. 15, 2013.

Opposition Against EP 1615971; Tenth Auxiliary Request—Claims; Apr. 15, 2013.

Opposition Against EP 1615971; Eleventh Auxiliary Request—Claims; Apr. 15, 2013.

Opposition Against EP 1615971; Twelfth Auxiliary Request—Claims; Apr. 15, 2013.

Opposition Against EP 1615971; Thirteenth Auxiliary Request—Claims; Apr. 15, 2013.

Opposition Against EP 1615971; Fourteenth Auxiliary Request—Claims; Apr. 15, 2013.

Opposition Against EP 1730212, Opposition Document from Herzog Fiesser & Partner; Heraeus Precious Metals GmbH; Aug. 10, 2011 [English Translation].

Opposition Against EP 1730212, Opposition Document from Herzog Fiesser & Partner; Heraeus Precious Metals GmbH; Aug. 10, 2011 [German].

Opposition Against EP 1730212; Observations of the Patentee; Jun. 25, 2012.

Opposition Against EP 1730212; Experimental Data I (D23); Jun. 25, 2012.

Opposition Against EP 1730212; Experimental Data II (D24); Jun. 25, 2012.

Opposition Against EP 1730212; Main Auxiliary Request—Claims; Jun. 25, 2012.

Opposition Against EP 1730212; First Auxiliary Request—Claims; Jun. 25, 2012.

Opposition Against EP 1730212; Second Auxiliary Request—Claims; Jun. 25, 2012.

Opposition Against EP 1730212; Third Auxiliary Request—Claims; Jun. 25, 2012.

Opposition Against EP 1730212; Fourth Auxiliary Request—Claims; Jun. 25, 2012.

Opposition Against EP 1730212; Fifth Auxiliary Request—Claims; Jun. 25, 2012.

Opposition Against EP 1730212; Sixth Auxiliary Request—Claims; Jun. 25, 2012.

Opposition Against EP 1730212; Seventh Auxiliary Request—Claims; Jun. 25, 2012.

Opposition Against EP 1730212; Eighth Auxiliary Request—Claims; Jun. 25, 2012.

Opposition Against EP 1730212; Ninth Auxiliary Request—Claims; Jun. 25, 2012.

U.S. Appl. No. 10/803,114 (Issued as US Patent 7,250,461; Jul. 31, 2007; This is the US counterpart to EP1730212) [Not submitted but granted patent listed on IDS].

U.S. Appl. No. 10/802,704 (Issued as US Patent 7,390,438; Jun. 24, 2008; This is the US counterpart to EP1615971) [Not submitted but granted patent listed on IDS].

U.S. Appl. No. 60/413,202 [Related to granted patent US 7,431,866; listed on IDS; Provisional document not submitted].

U.S. Appl. No. 60/464,369 (Issued as granted patent US 7,431,866, listed on IDS; Provisional document not submitted).

U.S. Appl. No. 60/464,370 [Provisional document not submitted].

Opposition to EP1546237: Report on the Attempted Reproduction of the Synthesis in D4 (PICKUP) and Example 7 of the opposed patent (D31).

Sze, S.M., Physics of Semiconductor Devices, 2nd Edition, 1981, John Wiley & Sons, p. 492.

Tang et al., "Organic/Inorganic Material for Coating on Metals," Materials Research Society Symp. Proc., vol. 734, 2003, pp. B.9.57.1-7.

Extended European Search Report for Application No. EP 06774120.7, counterpart to U.S. Appl. No. 11/475,702; Jan. 27, 2010.

Opposition Against EP 1615971; Letter from Opponent; Dec. 22, 2011 (German original and English translation).

Opposition Against EP 1615971; Grounds of Complaint of the Opposition; Appeal No. T1708/12-3.4.02; Apr. 11, 2013 (German original and English Machine Translation).

* cited by examiner

HIGH WORK-FUNCTION AND HIGH CONDUCTIVITY COMPOSITIONS OF ELECTRICALLY CONDUCTING POLYMERS

RELATED APPLICATION DATA

This application claims priority under 35 U.S.C. § 120 to U.S. application Ser. No. 11/960,412 (now abandoned), filed Dec. 19, 2007, which claims priority under 35 U.S.C. §119(e) from U.S. Provisional Application No. 60/878,033 filed on Dec. 29, 2006 which is incorporated by reference herein in its entirety.

BACKGROUND

1. Field of the Disclosure

The disclosure relates in general to high-conductivity, high work function compositions and more particularly to such compositions and their use in electronic devices.

2. Discussion of Related Art

Organic electronic devices define a category of products that include an active layer. Such devices convert electrical energy into radiation, detect signals through electronic processes, convert radiation into electrical energy, or include one or more organic semiconductor layers.

Organic light-emitting diodes (OLEDs) are organic electronic devices comprising an organic layer capable of electroluminescence. OLEDs can have the following configuration:

anode/buffer layer/EL material/cathode

The anode is typically any material that is transparent and has the ability to inject holes into the EL material, such as, for example, indium/tin oxide (ITO). The anode is optionally supported on a glass or plastic substrate. EL materials include fluorescent compounds, fluorescent and phosphorescent metal complexes, conjugated polymers, and mixtures thereof. The cathode is typically any material (such as, e.g., Ca or Ba) that has the ability to inject electrons into the EL material. The buffer layer is typically an electrically conducting polymer and facilitates the injection of holes from the anode into the EL material layer. The buffer layer may also have other properties which facilitate device performance.

There is a continuing need for buffer materials with improved properties.

SUMMARY

This disclosure describes simultaneous enhancement of electrical conductivity and work-function of aqueous electrically conducting polymer dispersions made by adding a perfluorinated polymeric acid dissolved in a high boiling solvent or a mixture of a high boiling solvent and water. The conducting polymers are made by oxidative polymerization of a conjugated monomer and a non-fluorinated polymeric acid in water. The high conductivity and high work function conducting polymers are useful for OLEDs as anode, photovoltaic cells, transparent conductive coatings, capacitor cathode of $Ta_2O_5$ and $Al_2O_3$, among other uses.

Disclosed are high conductivity and high work-function compositions comprising an aqueous dispersion or solution comprising an electrically conducting polymer and a perfluorinated polymeric acid.

In some embodiments, the conducting polymer comprises a polymer made of conjugated monomers or comonomers, and at least one non-fluorinated polymeric acid. In some more particular embodiments, the conjugated monomers are selected from thiophenes, selenophenes, thienothiophenes, and thienoselenophenes.

In an embodiment, the conducting polymer comprises a polymer made of conjugated monomers or comonomers, and at least one non-fluorinated polymeric acid. The conjugated monomers may be selected from the group consisting of 3,4-ethylenedioxythiophene and 3,4-ethylenedioxyselenophene.

In some embodiments, the perfluorinated polymeric acids are selected from perfluoroolefins having perfluoro-ether-sulfonic acid side chains. In further embodiments, the perfluorinated polymeric acids are selected from high molecular weight of perfluorinated sulfonamides. In yet further embodiments, the perfluorinated polymeric acid is copolymer of TFE (tetrafluoroethylene) and PSEPVE (3,6-dioxa-4-methyl-7-octene)sulfonic acid. In a still further embodiment, the composition comprises poly(3,4-ethylenedioxythiophene)-polystyrenesulfonic acid.

There are provided compositions have a conductivity of at least 100 S/cm.

There are provided compositions having a work function of at least 5.1 eV.

There are also provided device components and devices comprising compositions presented in the disclosure.

DETAILED DISCLOSURE

Aqueous electrically conducting polymer dispersions are generally made by oxidative polymerization of a conjugated monomer in the presence of a non-fluorinated polymeric acid. The conducting polymers have low conductivity and low work function, which limit their use for many applications.

This disclosure presents techniques for addition of a perfluorinated polymeric acid (PFA) to the aqueous polymer dispersions to achieve the high conductivity and high work function. The PFA can be first dissolved or dispersed in a high boiling polar solvent, such as ethylene glycol, dimethylsulfoxide, dimethylacetamide, N-methyl pyrrolidine, and the like. Boiling point of the high boiling solvents is preferably above 120° C. The PFA can also be first dissolved or dispersed in a mixture of a high boiling polar solvent. The addition can also be carried out by first adding a high boiling solvent to the aqueous polymer dispersion followed with a PFA solution or dispersion in water or by a reverse order of addition.

Initial conductivity of an aqueous conducting polymer dispersion should be at least 0.1 S (Siemens)/cm to achieve conductivity greater than 100 S/cm and work function greater than 5.1 eV after addition of a PFA polymer. For purposes of the information conveyed in this disclosure, the acid equivalent ratio of PFA to the non-fluorinated polymeric acid should be no more than 1.

In this disclosure, conjugated monomer includes thiophene, selenophene, 3,4-ethylenedioxythiophene, 3,4-ethylenedioxyselenophene, thienothiophene, thienoselenophene, and the like, pyrroles, and their comonomers. The polymeric acids are perfluorinated. The perfluoropolymeric acids (PFA) are preferably perfluoroolefins having perfluoro-ether-sulfonic acid side chains. pKa of the acids in water is preferably less than −5. The perfluoropolymeric acids include Nafion® polymer, a registered trademark of E. I. du Pont de Nemours and Company, Wilmington, Del., for copolymer of TFE (tetrafluoroethylene) and PSEPVE (3,6-dioxa-4-methyl-7-octenesulfonic acid). The acid also includes high molecular weight of perfluorinated sulfonamides.

For illustration of an embodiment of the disclosure, aqueous Poly(3,4-ethylenedioxythiophene), PEDOT/PSSA conducting polymer dispersion is added with a Nafion® polymer, P-(TFE-PSEPVE). Electrical conductivity greater than 100 S/cm and work function greater than 5.1 eV, as has been illustrated.

The high conductivity and high work function conducting polymer compositions can be used alone as anode without ITO. It is also useful as polymer solid cathodes in tantalum and aluminum capacitors. It should be also useful as a transparent conductor for photovoltaic cells and transparent coatings.

A) General Procedure of Sample Preparation and Workfunction Measurement:

The materials illustrated in Examples and Comparative Examples were spin-coated at a spin speed of 2,000 rpm for one minute on 30 mm×30 mm glass/indium/tin semiconductive oxide (ITO) substrates. The ITO/glass substrates consist of 15 mm×20 mm ITO area at the center having ITO thickness of 100 to 150 nm. At one corner of 15 mm×20 mm ITO area, ITO film surface extended to the edge of the glass/ITO serves as electrical contact with one of two Kelvin probe electrodes. Prior to spin coating, ITO/glass substrates were cleaned and the ITO side was subsequently treated with oxygen plasma for 15 minutes. Once spin-coated with an aqueous sample dispersion, the deposited layer on the corner of the extended ITO film was removed with a water-wetted cotton-swath tip. The exposed ITO pad was used to make contact with the one of two electrodes of a Kelvin probe. The deposited film was then dried in air at a hot-plate set at 200° C. for 10 minutes. The dried film samples in the range of ~30 nm thickness were then placed in a glass jug filled with nitrogen before capped till measurement.

For energy potential measurement, ambient-aged gold film was measured first as a reference prior to measurement of samples. The gold film on a same size of glass was placed in a cavity cut out at the bottom of a square steel container. On the side of the cavity, there are four retention clips to keep sample piece firmly in place. One of the retention clips is attached with electrical wire. The retention clip attached with the electrical wire was clipped on the ITO at the corner for making contact with the one of two electrodes of the Kelvin probe. The gold film was facing up a Kelvin probe tip protruded from the center of a steel lid, which was lowered to slightly above the center of the gold film surface. The lid was then screwed tightly onto the square steel container at four corners. A side port on the square steel container was connected with a tubing to allow nitrogen to sweep the Kelvin probe cell while a nitrogen exit port was capped with a septum in which a steel needle was inserted to maintain ambient pressure. The probe settings were then optimized for the probe and only height of the tip was adjusted during the measurement. The Kelvin probe tip was part of the second electrode which was also connected to a McAllister KP6500 Kelvin Probe meter having the following parameters: 1) frequency (Hz): 230; 2) amplitude (arbitrary): 20; 3) DC offset (volt): varied from sample to sample; 4) upper backing potential (volt): 2 ; 5) lower backing potential (volt): −2 ; 6) scan step: 1; 7) trigger delay (degree per full cycle): 0; 8) acquisition(A)/data(D) points:1024; 9) ND rate (Hz): 12405 @19.0 cycles; 10) D/A delay (milliseconds): 200; 11) set point gradient (unitless): 0.2; 12) step size (volt): 0.001; 13) maximum gradient deviation (volt): 0.001. As soon as the tracking gradient stabilized, the contact potential differential or CPD (expressed in volts) between gold film and probe tip was recorded. The CPD of gold and the probe tip was checked periodically to ensure reliable reference for calculation of energy potential of samples. For CPD measurement of samples with the probe tip, each sample was loaded into the cavity in the same manner as gold film sample. On the retention clip that makes electrical contact with the sample, extra care was taken to ensure that good electrical contact was made with the exposed ITO pad. During the CPD measurement a small stream of nitrogen was flown through the cell without disturbing the probe tip. Once CPD of a sample was recorded, work function of the sample was calculated by adding CPD of the sample to the difference of 4.7 eV and CPD of gold. 4.7 eV is the work function of an ambient-aged gold film [Surface Science, 316, (1994), P380]. The measured work function of a material is thus determined as required energy for removing electron from the surface of the material.

B) General Procedure of Film Sample Preparation, Four-probe Electrical Resistance Measurement and Calculation of Electrical Conductivity:

One drop of each dispersion sample was spread on a 3"×1" microscope slide to cover ⅔ area of the slide. Excess of liquid was tilted to one edge of the slide to be soaked-up by a tissue. Once a smooth, homogeneous layer of liquid was ensured, the slide was placed on a flat surface for initial drying at room temperature. The slide was then placed on a hot plate set at 200° C. Once the hot plate reached the temperature monitored with a surface thermometer, it was kept at the temperature for additional 5 minutes. The whole operation was carried out in air. The slide was removed from the hot plate and the film was trimmed to a long strip with a razor blade. Width of the strip ranged from 0.2 cm to 0.7 cm and the length was about 3 cm. Silver paste was then painted perpendicular to the length of the strip to form four electrodes. The two inner parallel electrodes were about 0.3 cm to 0.5 cm apart and were connected to a Keithley model 616 electrometer for measurement of voltage when a known current supplied by a Keithley model 225 Current Source was applied to the two other parallel electrodes. A series of corresponding current/voltage data obtained at room temperature was recorded to see whether Ohm's law was followed. All the samples in Examples and Comparative Examples followed Ohm's law, which provided a more or less identical resistance for the corresponding current/voltage data. Once measured was done, the area in the two inner electrodes was measured for thickness with a Profilometer. Since resistance, thickness, separation length of the two inner electrodes and the width of the filmstrip are known, electrical conductivity is then calculated. The conductivity unit is expressed as S (Siemens)/cm.

EXAMPLES

Comparative Example 1

This example illustrates electrical conductivity and workfunction of an electrically conductive poly(3,4-ethylenedioxythiophene), PEDOT,/poly(styrenesulfonic acid), PSSA.

PEDOT-PSSA is a well-known electrically conductive polymer. The polymer dispersed in water is commercially available from H. C. Starck GmbH (Leverkuson, Germany) in several grades under a trade name of Baytron®-P (a registered trademark of H. C. Starck). Baytron®-P HCV4, one of the commercial aqueous dispersion products, purchased from Starck was used to establish baselines of electrical conductivity and work function. The Baytron®-P HCV4 sample was determined gravimetrically to have 1.01% (w/w) solid, which should be PEDOT/PSSA in water. According to the product brochure, weight ratio of PEDOT:PSSA is 1:2.5.

Viscosity of the PEDOT-PSSA was very high, therefore deionized water was used to reduce viscosity for convenience of making homogeneous films. 2.5026 g Baytron®-P HCV4 was slowly added with 2.5106 g deionized water. This dilution reduces PEDOT-PSSA solid to about 0.50% (w/w). The mixture was then stirred with a shaker for two hours to ensure thorough mixing. Film samples preparation and film baking for conductivity and work function measurements were described in both general procedures. Work function was determined to be 4.97 eV. Conductivity of four film samples was determined to be 6.9, 13.4, 5.3, and 14.4 S/cm. The work-function is quite low and will be compared with those in Examples, which show about 0.5 to 0.6 eV higher.

Comparative Example 2

This example illustrates effect of ethylene glycol, a high boiling solvent, on increase of electrical conductivity, but not on workfunction of Baytron®-P HCV4.

Unlike Comparative Example 1, which only used water, this comparative example used a ~10% solution of ethylene glycol in water. The 10% solution was made by adding 0.9996 g ethylene glycol to 9.0098 g water. 2.53 g of the ethylene/water solution were added slowly to 2.5424 g HCV4. The amount of the solution also reduced PEDOT-PSSA to about 0.51%. The mixture was stirred with a shaker for two hours to ensure thorough mixing. The amount of ethylene glycol/water solution represents 5.0% (w/w) ethylene glycol in the diluted HCV4. Film preparation for conductivity measurement was described in the general procedure. Conductivity of two film samples was measured to be 303.14 S/cm, and 223.0 S/cm. This conductivity data is in line with the data cited by H. C. Starck GmbH in the Company's website where they report minimum conductivity of 200 S/cm by adding 5% dimethylsulfoxide (DMSO), which is a high boiling solvent. A more direct comparison will be shown in Comparative Example 3 where DMSO was used. It is well known in open arts that high boiling solvent such as ethylene glycol, dimethylsulfoxide and the like can greatly enhance electrical conductivity of PEDOT-PSSA.

A similar mixture prepared according to the same amount of each component and same recipe was used for work-function measurement. It was determined to have work-function of 4.95 eV. Although conductivity has increased to 10-20 times when compared with addition of water alone, but work-function remains the same as that in Comparative Example 1 where only water was used for dilution. The work-function is quite low and will be compared with those in Examples, which show about 0.5 eV to 0.6 eV higher.

Comparative Example 3

This example illustrates effect of dimethylsulfoxide, a high boiling solvent, on increase of electrical conductivity, but not on work-function of Baytron®-P HCV4.

Unlike Comparative Example 1, which only used water, this comparative example used a ~10% solution of dimethylsulfoxide (DMSO) in water. The 10% solution was made by adding 1.0034g DMSO to 9.0033g water. 3.0097 g of the solution were added slowly to 3.0196 g HCV4. The amount of the solution also reduced PEDOT-PSSA to about 0.51%. The mixture was stirred with a shaker for two hours to ensure thorough mixing. The amount of DMSO/water solution represents 5.0% (w/w) DMSO in the diluted HCV4. Film preparation for conductivity measurement was described in the general procedure. Conductivity of two film samples was measured to be 219.2 S/cm, and 307.0 S/cm, respectively. This conductivity data is in line with the data cited by H. C. Starck GmbH in the Company's website where they report minimum conductivity of 200 S/cm by adding 5% dimethylsulfoxide (DMSO).

A similar mixture prepared according to the same amount of each component and same recipe shown above was used for work-function measurement. It was determined to have work-function of 4.97 eV. Although conductivity has increased to 10-20 times compared with addition of water alone, but work-function remains the same. The work-function is quite low and will be compared with those in Examples, which show about 0.5 eV to 0.6 eV higher.

Example 1

This example illustrates enhancement of work function without losing high electrical conductivity by adding a Nafion® polymer contained in ethylene glycol to Baytron®-P HCV4.

Nafion® polymer, a perfluoropolymeric acid, for copolymer of TFE (tetrafluoroethylene) and PSEPVE (3,6-dioxa-4-methyl-7-octenesulfonic acid). Nafion® polymer, P-(TFE-PSEPVE), used in this example was obtained by slow removing of water from an aqueous dispersion of Nafion® in vacuum at the temperature below 10° C. The aqueous dispersion of Nafion® was prepared by heating P-(TFE/PSEPVE) having EW (equivalent weight: weight of the polymer per one sulfonic acid group) of 1050 in water only to ~270° C. The aqueous Nafion® dispersion had 25% (w/w) P-(TFE/PSEPVE) in water and was diluted to ~12% with deionized water prior to removing water for collecting P-(TFE-PSEPVE). The collected P-(TFE-PSEPVE) solids were soluble or dispersible in many high polar solvents or mixture of the solvent with water. It should be pointed out that any perfluoropolymeric acids (PFA) could be obtained by removing liquid medium from aqueous or non-aqueous dispersion or solution at a temperature less than the "coalescence temperature" of the PFA. By "coalescence temperature" is meant the temperature at which a dried solid of the PFA is cured to a stable solid which is not redispersible in water, other polar solvent or mixture of the polar solvent.

Before mixing with Baytron®-P HCV4, a Nafion® polymer/ethylene glycol solution and an ethylene glycol/water solution were prepared first. The latter solution was for reducing PEDOT-PSSA solid % of HCV4 as done in the previous comparative examples, therefore reducing its viscosity. 0.7541g P-(TFE-PSEPVE) having EW of 1050 was added to 9.2534 g water n a glass vial. The mixture was heated to ~120° C. until P-(TFE-PSEPVE) solids were all dissolved. Weight % (w/w) of P-(TFE-PSEPVE) in the ethylene glycol solution is 7.51%. A ~10% (w/w) ethylene glycol in water was made by adding 0.9996g ethylene glycol to 9.0098g water. To 5.0833 g Baytron®-P HCV4 was first added slowly with 0.5872g poly(TFE-PSEPVE)/ethylene glycol solution. To the mixture, 5.5310 g ethylene glycol/water solution was added to reduce PEDOT-PSSA polymer solid %, which became 0.46%. The combined amount of water/ethylene glycol solution and P-(TFE-PSEPVE)/ethylene glycol represents 9.8% (w/w) ethylene glycol in the final formulation of HCV4. Based on the amount of PEDOT-PSSA and P-(TFE-PSEPVE), acid equivalent ratio of P-(TFE-PSEPVE) to PSSA is 0.21. This ratio is used for specifying optimal concentration of P-(TFE-PSEPVE) with respect to PSSA for overall consideration of desired electrical conductivity and work-function.

Film preparation for conductivity measurement was described in the general procedure. Conductivity of two film samples was measured to be 357.8 S/cm, and 291.1 S/cm. A similar mixture prepared according to the same amount of each component and same recipe shown above was used for work-function measurement. It was determined to have work-function of 5.54 eV. The work-function is about 0.5 eV higher than those in Comparative Examples 1, 2 and 3. It should be also pointed out that electrical conductivity retains at about the same as those in Comparative Examples 2 and 3.

Example 2

This example illustrates enhancement of work function without losing high electrical conductivity by adding a higher amount of Nafion® polymer contained in dimethylsulfoxide to Baytron®-P HCV4.

A Nafion® polymer, P-(TFE-PSEPVE), used Example 1 was used here. Before mixing with Baytron®-P HCV4, a Nafion® polymer/dimethyl sulfoxide (DMSO) solution and a DMSO/water solution were prepared first. The latter solution was for reducing PEDOT-PSSA solid % of HCV4 as done in the previous comparative examples and Examples, therefore reducing its viscosity. 1.0510 g P-(TFE-PSEPVE) having EW of 1050 was added to 8.9686 g water in a glass vial. The mixture was heated to ~120° C. until P-(TFE-PSEPVE) solids were all dissolved. Weight % (w/w) of P-(TFE-PSEPVE) in the DMSO solution is 10.49%. A ~10% (w/w) DMSO in water was made by adding 1.0034g DMSO to 9.0035g water. To 2.5048 g Baytron-P HCV4 was first added slowly with 2.5192 g DMSO/water solution to reduce PEDOT-PSSA solid %, which became 0.48%. To the mixture, 0.2023 g DMSO/P-(TFE-PSEPVE) solution was added. The combined amount of water/DMSO solution and P-(TFE-PSEPVE)/DMSO represents 8.3% (w/w) DMSO in the final formulation of HCV4. Based on the amount of PEDOT-PSSA and P-(TFE-PSEPVE), acid equivalent ratio of P-(TFE-PSEPVE) to PSSA is 0.21. This ratio is used for specifying optimal concentration of P-(TFE-PSEPVE) with respect to PSSA for overall consideration of desired electrical conductivity and work-function.

Film preparation for conductivity measurement was described in the general procedure. Conductivity of two film samples was measured to be 267.3S/cm, and 231.3 S/cm. This data shows that adding a P-(TFE-PSEPVE) polymer to HCV4 still preserve the conductivity. Work function of this material has not been performed, but I should expect a value similar to 5.54 eV presented in Example 1, but will be slightly lower than that (5.64 eV) in Example 3.

Example 3

This example illustrates enhancement of work function without losing high electrical conductivity by adding a higher (compared with that of Examples 1 and 2) amount of Nafion® polymer to Baytron®-P HCV4.

A Nafion® polymer, P-(TFE-PSEPVE), used Example 1 was used here. Before mixing with Baytron®-P HCV4, a Nafion® polymer/ethylene solution and a DMSO/water solution were prepared first. The latter solution was for reducing PEDOT-PSSA solid % of HCV4 as done in the previous comparative examples and Examples, therefore reducing its viscosity. 0.7541g P-(TFE-PSEPVE) having EW of 1050 was added to 9.2534 g water in a glass vial. The mixture was heated to ~120° C. until P-(TFE-PSEPVE) solids were all dissolved. Weight % (w/w) of P-(TFE-PSEPVE) in the DMSO solution is 7.51%. A ~10% (w/w) DMSO in water was made by adding 1.0034 g DMSO to 9.0035g water. To 2.5066 g Baytron®-P HCV4 was first added slowly with 3.0132 g DMSO/water solution to reduce PEDOT-PSSA solid %, which became 0.48%. To the mixture, 0.0.5666 g P-(TFE-PSEPVE)/ethylene glycol solution was added. The combined amount of water/DMSO solution and P-(TFE-PSEPVE)/ethylene glycol represents 14.2% (w/w) of combined DMSO and ethylene glycol in the final formulation of HCV4. Based on the amount of PEDOT-PSSA and P-(TFE-PSEPVE), acid equivalent ratio of P-(TFE-PSEPVE) to PSSA is 0.41. This ratio is used for specifying optimal concentration of P-(TFE-PSEPVE) with respect to PSSA for overall consideration of desired electrical conductivity and work-function.

Film preparation for conductivity measurement was described in the general procedure. Conductivity of two film samples was measured to be 153.9 S/cm, and 191.7 S/cm. This data shows that adding a P-(TFE-PSEPVE) polymer to HCV4 still has the conductivity, but may start to lose ground if equivalent ratio of P-(TFE-PSEPVE) to PSSA gets much higher than 0.41. A similar mixture prepared according to the same amount of each component and same recipe shown above was used for work-function measurement. It was determined to have work-function of 5.64 eV. The work-function is about 0.6 eV higher than those in Comparative Examples 1, 2 and 3 and shows that 0.41 equivalent ratio of P-(TFE-PSSA) to PSSA provides a slightly higher work-function than 0.21 equivalent ratio. This again, points out that equivalent ratio should be kept below 1, preferably below 0.6.

Comparative Example 4

This example illustrates minimum conductivity of an electrically conductive polymer for conductivity enhancement with addition of a high boiling solvent.

In this Comparative Example, Baytron®-P PH500, an aqueous dispersion of PEDOT-PSSA from H. C. Starck GmbH (Leverkuson, Germany) was used to establish minimum conductivity requirement for reaching conductivity higher than 100 S/cm with a high boiling solvent. The Baytron®-P PH500 sample was determined gravimetrically to have 1.0% (w/w) solid, which should be PEDOT/PSSA in water. According to the product brochure, weight ratio of PEDOT:PSSA is 1:2.5.

Viscosity of Baytron®-P PH500 is much lower than that of Baytron®-P HCV4, therefore there is no need to dilute for preparing thin films for conductivity measurement. Conductivity of two film samples was determined to be 0.85 and 0.53 S/cm. The conductivity is also much lower than that of Baytron®-P HCV4. However, Example 4 shown below will demonstrate increased conductivity by adding a Nafion® polymer, P-(TFE-PSEPVE), dissolved in ethylene glycol.

Example 4

This example illustrates conductivity enhancement of Baytron®-P PH500 by adding a Nafion® polymer contained in ethylene glycol.

A Nafion® polymer, P-(TFE-PSEPVE), used Example 1 was used here. Before mixing with Baytron®-P PH500, a Nafion® polymer/ethylene glycol solution was prepared first. 1.0512 g P-(TFE-PSEPVE) having EW of 1050 was added to 8.8.9517 g ethylene glycol in a glass vial. The mixture was heated to ~120° C. until P-(TFE-PSEPVE) solids were all dissolved. Weight % (w/w) of P-(TFE-PSEPVE) in the ethylene glycol solution is 10.51%. To 5.0012 g Baytron®-P PH500 was first added slowly with 0.3680 g P-(TFE-PSEPVE)/ethylene glycol solution. The amount of P-(TFE-PSEPVE)/ethylene glycol represents 6.13% (w/w) ethylene glycol in the final formulation of PH500. Based on the amount of PEDOT-PSSA and P-(TFE-PSEPVE), acid equivalent ratio of P-(TFE-PSEPVE) to PSSA is 0.19.

Film preparation for conductivity measurement was described in the general procedure. Conductivity of two film samples was measured to be 288.7 S/cm, and 449.4 S/cm. This data shows that adding a P-(TFE-PSEPVE) polymer to PH500 has greatly enhanced conductivity of PH500. This data shows that minimum conductivity for conductivity enhancement to greater than 100 S/cm should be greater than 0.1 S/cm. Work function of this material has not been performed, but I should expect a value similar to 5.54 eV presented in Example 1, but will be slightly lower than that (5.64 eV) in Example 3.

Note that not all of the activities described above in the general description or the examples are required, that a portion of a specific activity may not be required, and that one or more further activities may be performed in addition to those described. Still further, the order in which activities are listed is not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges include each and every value within that range.

In some embodiments, the invention herein can be construed as excluding any element or process step that does not materially affect the basic and novel characteristics of the composition or process. Additionally, in some embodiments, the invention can be construed as excluding any element or process step not specified herein.

The use of numerical values in the various ranges specified herein is stated as approximations as though the minimum and maximum values within the stated ranges were both being preceded by the word "about." In this manner slight variations above and below the stated ranges can be used to achieve substantially the same results as values within the ranges. Also, the disclosure of these ranges is intended as a continuous range including every value between the minimum and maximum average values including fractional values that can result when some of components of one value are mixed with those of different value. Moreover, when broader and narrower ranges are disclosed, it is within the contemplation of this invention to match a minimum value from one range with a maximum value from another range and vice versa.

What is claimed is:

1. High conductivity and high work-function compositions comprising an aqueous dispersion or solution comprising an electrically conducting polymer and a perfluorinated polymeric acid, wherein
    the conducting polymer comprises a polymer made of conjugated monomers or comonomers, and at least one non-fluorinated polymeric acid; and
    the conjugated monomers are selected from thiophenes, and thienothiophenes;
    the perfluorinated polymeric acids are selected are selected from high molecular weight of per fluorinated sulfonimides; and
    the perfluorinated polymeric acid is dissolved or dispersed in a high boiling polar solvent having a boiling point above 120° C.

2. A composition of claim 1 wherein the conjugated monomers are selected from the group consisting of 3,4-ethylenedioxythiophene.

3. A composition of claim 1 wherein the conductivity is at least 100 S/cm.

4. A composition of claim 1 wherein the work-function is at least 5.1 eV.

5. A composition of claim 1, wherein the solvent is selected from the group consisting of ethylene glycol, dimethylsulfoxide, dimethylacetamide, and N-methylpyrrolidone.

* * * * *